April 26, 1960 W. S. PERCIVAL 2,934,710

DISTRIBUTED AMPLIFIERS

Filed Nov. 30, 1956

Inventor
W. S. Percival
By Hascock Downing Seebold
Attys

United States Patent Office 2,934,710

Patented Apr. 26, 1960

2,934,710

DISTRIBUTED AMPLIFIERS

William Spencer Percival, West Ealing, London, England, assignor to Electric & Musical Industries Limited, Hayes, Middlesex, England, a company of Great Britain Application November 30, 1956, Serial No. 625,295

Claims priority, application Great Britain December 1, 1955

9 Claims. (Cl. 330—54)

Figure 1:
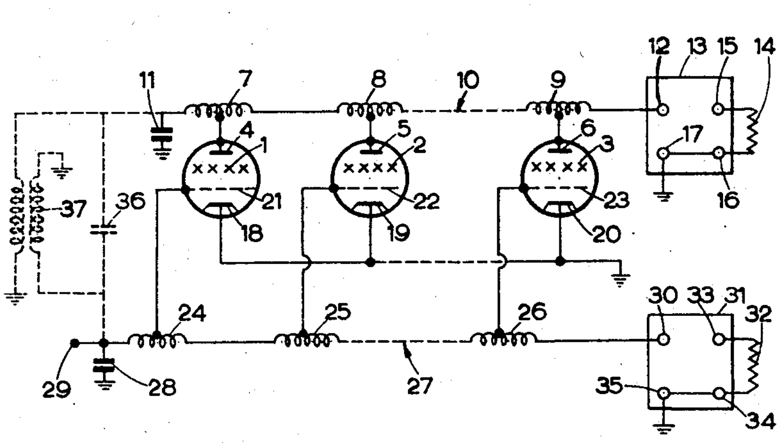

This invention relates to distributed amplifiers such as are used, for example, for the distribution of radio and television programmes to blocks of flats.

Where amplification of Band I, Band II, and Band III and normal radio signals is required the use of a distributed amplifier covering a wide band has been suggested, and has several advantages over the use of individual channel amplifiers. Cross modulation is small due to the large number of parallel valves, and the failure of one valve results in only a very small reduction in signal strength, this producing obvious advantages in maintenance. Moreover, there is no necessity with a distributed amplifier to mix signals from different channels at the output.

Distributed amplifiers have, however, one important disadvantage when employed as distribution amplifiers in that their response is substantially uniform throughout their pass band whereas only a part of the total band width is occupied by the desired signals, and wide gaps occur between the occupied regions. In a practical case the overall band width may be about three times the bandwidth used by the received signals. This results in the necessity for even more valves than for separate channel amplifiers, and also in considerable noise due to the amplification of signals outside the required bands.

The object of the present invention is to modify a distributed amplifier in such a way that its response in desired frequency bands is increased relative to the response in intermediate frequency bands.

According to the invention there is provided a distributed amplifier for the selective amplification of at least one band of signals in a wider band of signals, comprising a plurality of amplifying devices each having at least a control electrode and an output electrode, an output electrode line interconnecting the output electrodes and a control electrode line interconnecting the control electrodes of said amplifying devces, means for applying input signals in said wider band to said control electrode line, the ends of said output electrode and control electrode lines remote from the input ends being unconnected, means for causing signals applied to at least one of said output electrode and control electrode lines to be reflected therein, and time delay means for imparting such a time delay to the signals passing from one end to the other of said at least one line to cause said reflected signals and said applied signals to be in phase only in said at least one band of signals, thereby effecting said selective amplification.

In one embodiment of the invention a distributed amplifier is provided in which at least one of the anode line and grid line thereof is mis-matched to introduce resonance into said amplifier so as to increase the stage gain in desired frequency bands relative to the stage gain in remaining frequency bands.

By virtue of the invention fewer valves may be necessary than with separate channel amplifiers for each desired frequency region, and in addition interference arising from signals of frequencies outside the required bands would be eliminated.

Preferably, moreover, overall feedback is applied to a stage or stages of distributed amplification for the purpose of mitigating loss of gain at high freqencies.

The amplitude-frequency response of a conventional distributed amplifier is approximately flat, and this condition is brought about by the elimination of the reflection of frequencies within the usual band. In the present invention said reflections are utilized to produce an amplitude-frequency response having maxima in the useful frequency bands and minima in those frequency bands which it is desirable to reject.

In the conventional distributed amplifier it is usual to endeavour to obtain a time delay along the lines which is substantially independent of frequency within the required bandwidth. Thereby, as is well-known, an improved transient response is obtained. If reflections were introduced at the ends of such a line, the resonant frequencies would bear an integral relation to one another. In practice, for a distribution amplifier, such a simple integral relation may not be required. In accordance with a feature of the invention, the time delay between the points at which reflection occurs may be caused to vary with frequency in such a manner that the maxima and minima of the amplitude-frequency response occur at the required frequencies.

Figure 2:
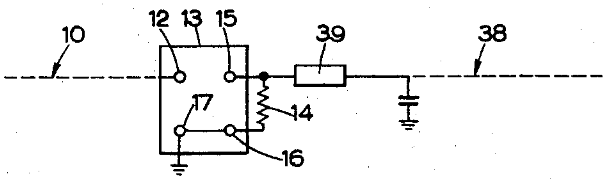

In order that the invention may be better understood, reference will be made to the accompanying drawings, in which:

Figure 1 shows diagrammatically a distributed amplifier in accordance with one embodiment of the invention, and Figure 2 shows coupling means between two distributed amplifiers in accordance with a feature of the invention.

Referring to Figure 1 of the drawings the distributed amplifier comprises a plurality of tetrode valves of which three such valves 1, 2 and 3 are shown having their anodes 4, 5 and 6 respectively connected to tappings on inductors 7, 8 and 9, said inductors being connected together in series to form an anode line 10. The end of said anode line 10 adjacent to the valve 1 is connected to ground via a condenser 11 and the other end of said line is attached to a terminal 12 of a known form of phase changing network indicated by the rectangle 13. A load resistor 14 is connected to terminals 15 and 16 of said phase changing network, the terminal 16 and a fourth terminal 17 of the network being both connected to ground. The cathodes 18, 19 and 20 of the tetrode valves are all connected to ground. The control electrodes 21, 22 and 23 of the three shown valves 1, 2 and 3 are connected to tappings on inductors 24, 25 and 26, said inductors being connected together in series to form a grid line 27. The end of said grid line adjacent to the valve 1 is connected to earth via a condenser 28 and to a terminal 29 and the other end of said grid line 27 is connected to a terminal 30 of a second phase changing network denoted by the rectangle 31 arranged in a similar manner to the phase changing network 13 with a resistor 32 connected to terminals 33 and 34, the terminal 34 and a fourth terminal 35 being connected to ground.

The load resistance 14 of the anode line is made greater than the nominal impedance of said line.

In the embodiment shown in Figure 1 the anode line 10 is mismatched at its end remote from the load and, in most cases, it will be mismatched also by the load. In this example said line is mismatched by the load and is an open circuit at the end remote from the load. The line will then resonate at a fundamental frequency at which the line is half a wavelength long. However, it will also resonate at all frequencies within the pass band of the line which are complete multiples of the fundamental frequency. These frequencies are modified by the phase changing network 13 which causes the time delay from one end of the line to the other to vary with frequency in a suitable manner.

Assuming that the grid line is matched by the load resistor 32, if a very short pulse is applied to said line via the terminal 29, as said pulse travels to the right a pulse of steadily increasing amplitude will travel along the anode line to the load resistor 14 when it will be reflected and so travel back and forth along the anode line energising the load resistor 14 with the consequent succession of pulses having intervals equal to twice the delay time along the anode line. Hence, the resonant frequency will be one half of said delay time and the harmonics of this frequency which lie within the pass band of the line. The energy initially in the resultant anode line pulse must be the same as for the conventional arrangement of a distributed amplifier having a matched anode line. Moreover, neglecting stray losses, all this energy must eventually be delivered to the load. Hence the effect of mismatching the anode line, when the input is a short pulse, is to change the frequency response without affecting the energy delivered to the load.

For convenience it will be assumed that the load is supplied through a transformer and that the mismatching is accomplished by varying the ratio of this transformer, the load resistance itself remaining constant. It is then easily shown that the condition for constant bandwidth x stage gain is that the energy delivered to the load is independent of the ratio of the transformer. Strictly speaking, this would be the case only if the response remained substantially flat within the pass bands, or if a more precise definition of the pass bands were given. However, a flat response is not necessary for a distribution amplifier, although it will be shown later that a relatively flat response can be obtained if required. Hence for practical purposes it is possible to say that the bandwidth x stage gain is independent of the transformer ratio, while the width of the pass bands is controlled by the transformer ratio. Hence the main object of the invention can be secured for the output stage. It is known that a transformer can be employed if required, while the optimum load resistance can often be obtained by other means.

If $R_0$ is the nominal impedance of the anode line and R is the value of the anode load resistor, and if $a$ is defined as the ratio of R to $R_0$, then as $a$ is increased the bandwidth will decrease and the gain will increase. By the use of suitable networks the value of $a$ can be made different for different pass bands thereby obtaining the optimum combination of gain and bandwidth for each pass band.

Assuming that the grid line 27 is similiar to the anode line 10 in Figure 1 of the drawings except possibly for the impedance level, if said grid line is fed with a constant current via the terminal 29 the response of the grid line will be substantially similar to that of the anode line. Thus, an applied pulse will travel along the grid line in step with the first pulse travelling to the right along the anode line. The successive reflected pulses will also travel back and forth in step. As a general rule there will be a difference between the anode and grid lines in that the anode pulse will be attenuated almost entirely by absorption in the load whereas the grid line pulse is likely to be appreciably attenuated by the input resistances of the valve. If desired, this additional attenuation in the grid line may be compensated for by suitable adjustment of the terminating resistance on the right hand end of the grid line.

The overall response of the last stage of amplification as described will be rather similar to that of a single stage of band-pass amplification using a single valve except that there will be several pass bands and several stop bands. The response of the stage within the pass-bands may be flattened by a form of stagger tuning in which the resonant frequencies of the grid line are made slightly different from those of the anode line.

In practice, the last stage of a distributed amplifier is likely to be fed from a previous stage of distributed amplification. It would be possible to make the grid line a continuation of the previous anode line, the latter being otherwise undamped. However, this would double the delay and hence double the number of peaks in the total band of the amplifier. The gain within the bands required would thereby be reduced.

A preferred method is to couple the anode line 10 and the following grid line 38 by a suitable reactance, or reactive network 39, as shown in Figure 2 whereby the two lines form the two resonant circuits of a band-pass network. The coupling reactance could itself be a line designed to give the correct reactance within each band.

It will be appreciated that, within the scope of the invention, many modifications are possible whereby known techniques are employed to control the damping, delays and coupling of the lines and hence the amplitude, resonant frequencies, flatness and width of the peaks.

A further feature of the invention will now be described whereby an anticipated loss of gain at the highest frequencies can be overcome.

It is well-known that the gain of a conventional distributed amplifier tends to fall off at the highest frequencies owing to grid damping associated with lead inductance and transit time. To some extent this may be compensated by positive reaction in each separate valve produced, for example, by a capacitive impedance in the cathode lead or an inductance in the screen lead. It is not, however, possible to apply feedback to the stage as a whole without losing the desirable features of substantially constant gain and time delay up to some limiting frequency.

However, constant gain and time delay are not required in a distributed amplifier used as a distribution amplifier. It is therefore possible to apply feedback to a stage as a whole. Such feedback is simpler to apply and to modify than when applied to each individual stage.

Overall feedback may, therefore, be applied to a stage or stages of distributed amplification of the type described for the purpose of increasing the gain by positive feedback, for example, to compensate for grid losses in the valves, or linearising the characteristic by negative feedback for the reduction of cross modulation, for example, and of modifying the frequency response.

The effect of feedback can be seen most clearly by supposing the input to consist of a short pulse. Feedback can then be obtained by diverting a portion of the pulse travelling along the anode line into the grid line of the same stage. If positive feedback is required the diverted pulse is caused to add to the amplitude of the pulse travelling along the grid line while, if negative feedback is required, the diverted pulse is caused to subtract from the amplitude of the pulse travelling along the grid line. This condition for the coincidence of the feedback pulse with the already existing pulse in the grid line so as to form a single pulse travelling along the grid line in step with the pulse travelling along the anode line, is a feature of the invention which has no analogue in ordinary feedback networks.

The effect of the pulse relationship described above, which applies strictly only to lines of uniform relay, is that, from the frequency point of view, the feedback applies to all pass bands. However, as already pointed out, it may be convenient to cause the time delay to vary with frequency in order to obtain peaks at desired frequencies. The feedback would then be arranged to have the correct phase relations for each of the pass bands.

In the diagram, negative feedback could be obtained by connecting a small capacitor between the left hand ends of the grid and anode lines as indicated dotted at 36 and slightly reducing the values of the shunt capacitances 11 and 28. This circuit would be appropriate for any adjustment of the two phase changing networks 14 and 32. Positive feedback could be obtained with the aid of a transformer, as indicated at 37.

It will be understood that the term distributed amplifier as employed above includes the case of a transmission line valve, which is the limiting case of a distributed amplifier when the number of valves tends to infinity and the capacitance and the inductance per section tends to zero.

The present invention has been particularly described with reference to a distributed amplifier having grid and anode lines with resistive loads. It will be appreciated that the invention may equally well be applied to the case of other loads, for example, inductive loads.

What I claim is:

1. A distributed amplifier for the selective amplification of at least one band of signals in a wider band of signals comprising a plurality of amplifying devices each having at least a control electrode and an output electrode, an output electrode line interconnecting the output electrodes and a control electrode line interconnecting the control electrodes of said amplifying devices, means for supplying input signals in said wider band to said control electrode line, the ends of said output electrode and control electrode lines remote from the input ends being unconnected to each other, means for causing signals applied to at least one of said output electrode and control electrode lines to be reflected therein, and time delay means coupled to said at least one line for imparting such a time delay to the signals passing from one end to the other of said at least one line as to cause said reflected signals and said applied signals to be in phase only in said at least one band of signals, thereby effecting said selective amplification.

2. A distributed amplifier for the selective amplification of at least one band of signals in a wider band of signals comprising a plurality of amplifying devices each having at least a control electrode and an output electrode, an output electrode line interconnecting the output electrodes and a control electrode line interconnecting the control electrodes of said amplifying devices, means for supplying input signals in said wider band to said control electrode line, the ends of said output electrode and control electrode lines remote from the input ends being unconnected to each other, a mis-matched load terminating one end of at least one of said output electrode and control electrode lines and the other end of said at least one line being an open circuit to cause signals applied to said at least one line to be reflected at said ends, and time delay means coupled to said at least one line for imparting such a time delay to the signals passing from one end to the other end of said at least one line as to cause said reflected signals and said applied signals to be in phase only in said at least one band of signals, thereby effecting said selective amplification.

3. A distributed amplifier for the selective amplification of at least one band of signals in a wider band of signals comprising a plurality of amplifying devices each having at least a control electrode and an output electrode, an output electrode line interconnecting the output electrodes and a control electrode line interconnecting the control electrodes of said amplifying devices, means for supplying input signals in said wider band to said control electrode line, the ends of said output electrode and control electrode lines remote from the input ends being unconnected to each other, a mismatched load terminating one end of at least one of said output electrode and control electrode lines and the other end of said at least one line being an open circuit to cause signals applied to said at least one line to be reflected at said ends, and a network for changing the phase of the signals in accordance with frequency connected between said at least one line and said mismatched load for imparting such a time delay to the signals passing from one end to the other end of said at least one line as to cause said reflected signals and said applied signals to be in phase only in said at least one band of signals, thereby effecting said selective amplification.

4. A distributed amplifier for the selective amplification of at least one band of signals in a wider band of signals comprising a plurality of amplifying devices each having at least a control electrode and an output electrode, an output electrode line interconnecting the output electrodes and a control electrode line interconnecting the control electrodes of said amplifying devices, means for supplying input signals in said wider band to said control electrode line, the ends of said output electrode and control electrode lines remote from the input ends being unconnected to each other, a mismatched resistive load terminating one end of at least one of said output electrode and control electrode lines and the other end of said at least one line being an open circuit to cause signals applied to said at least one line to be reflected at said ends, and the resistance of said resistive load is greater than the nominal impedance of said at least one line, and a network for changing the phase of the signals in accordance with frequency connected between said at least one line and said mismatched load for imparting such a time delay to the signals passing from one end to the other end of said at least one line as to cause said reflected signals and said applied signals to be in phase only in said at least one band of signals, thereby effecting said selective amplification.

5. A distributed amplifier for the selective amplification of at least one band of signals in a wider band of signals comprising a plurality of amplifying devices each having at least a control electrode and an output electrode, an output electrode line interconnecting the output electrodes and a control electrode line interconnecting the control electrodes of said amplifying devices, means for supplying input signals in said wider band to said control electrode line, the ends of said output electrode and control electrode lines remote from the input ends being unconnected to each other, a resistive load terminating one end of at least one of said output electrode and control electrode lines, a transformer connected between said resistive load and said at least one line, and having a variable ratio to mismatch said load and the other end of said at least one line being an open circuit to cause signals applied to said at least one line to be reflected at said ends, and the resistance of said resistive load is greater than the nominal impedance of said at least one line, and a network for changing the phase of the signals in accordance with frequency connected between said at least one line and said mismatched load for imparting such a time delay to the signals passing from one end to the other end of said at least one line that said reflected signals and said applied signals are in phase only in said at least one band of signals, thereby effecting said selective amplification.

6. A distributed amplifier for the selective amplification of at least one band of signals in a wider band of signals comprising a plurality of amplifiying devices each having at least a control electrode and an output electrode, an output electrode line interconnecting the output electrodes and a control electrode line interconnecting the control electrodes of said amplifying devices, means for supplying input signals in said wider band to said control electrode line, the ends of said output electrode and control electrode lines remote from the input ends being unconnected to each other, means for causing signals applied to at least one of said output electrode and control electrode lines to be reflected therein, time delay means coupled to said at least one line for imparting such a time delay to the signals passing from one end to the other of said at least one line as to cause said reflected signals and said applied signals to be in phase only in said at least one band of signals, thereby effecting said selective amplification, and a positive feedback path from said output electrode line to said input end of said control electrode line, the length of said feedback path being such as to cause signals fed back to said control electrode line to coincide with signals supplied directly to said control electrode line.

7. A distributed amplifier for the selective amplification of at least one band of signals in a wider band of signals comprising a plurality of amplifying devices each having at least a control electrode and an output electrode, an output electrode line interconnecting the output electrodes and a control electrode line interconnecting the control electrodes of said amplifying devices, means for supplying input signals in said wider band to said control electrode line, the ends of said output electrode and control electrode lines remote from the input ends being unconnected to each other, means for causing signals applied to at least one of said output electrode and control electrode lines to be reflected therein, and time delay means coupled to said at least one line for imparting such a time delay to the signals passing from one end to the other of said at least one line as to cause said reflected signals and said applied signals to be in phase only in said at least one band of signals thereby effecting said selective amplification, and a negative feedback path from said output electrode line to said input end of said control electrode line, the length of said feedback path being such as to cause signals fed back to said control electrode line to coincide with signals supplied directly to said control electrode line.

8. A circuit arrangement for distribution amplification comprising a first distributed amplifier for the selective amplification of at least one band of signals in a wider band of signals comprising a plurality of amplifying devices each having at least an output electrode, an output electrode line interconnecting the output electrodes of said amplifying devices, means for causing signals applied to said output electrode line to be reflected therein, and means for controlling the time delay of signals from one end to the other of said output electrode line to cause said reflected signals and said applied signals to be in phase only in said at least one band of signals, thereby effecting said selective amplification, and a second distributed amplifier for the selective amplification of said at least one band of signals comprising a second plurality of amplifying devices each having at least a control electrode, a control electrode line interconnecting the control electrodes of said second amplifying devices, means for supplying input signals in said wider band to said control electrode line, the ends of said output electrode and control electrode lines remote from the input ends being unconnected to each other, means for causing signals applied to said control electrode line to be reflected therein, and time delay means coupled to said control electrode line for imparting such a time delay to the signals passing from one end to the other of said control electrode line as to cause said reflected signals and said supplied signals to be in phase only in said at least one band of signals, thereby effecting said selective amplification, and a reactive element connected between said output electrode line of said first distributed amplifier and said control electrode line of said second distributed amplifier to cause said output electrode and control electrode lines to constitute the two resonant circuits of a band-pass network for said at least one band of signals.

9. A circuit arrangement according to claim 8 in which said reactive element is a transmission line providing required reactance in said at least one band of signals.

References Cited in the file of this patent

UNITED STATES PATENTS

| | | |
|---|---|---|
| 2,593,948 | Wiegand et al. | Apr. 22, 1952 |
| 2,670,408 | Kelley | Feb. 23, 1954 |
| 2,745,004 | Yu | May 8, 1956 |
| 2,857,483 | Bell | Oct. 21, 1958 |
| 2,863,006 | Diambra et al. | Dec. 2, 1958 |